(12) United States Patent
Gordon et al.

(10) Patent No.: US 8,614,111 B2
(45) Date of Patent: Dec. 24, 2013

(54) FULLY DEPLETED SILICON ON INSULATOR NEUTRON DETECTOR

(75) Inventors: Michael S. Gordon, Yorktown Heights, NY (US); Kenneth P. Rodbell, Sandy Hook, CT (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 13/189,848

(22) Filed: Jul. 25, 2011

(65) Prior Publication Data

US 2013/0026544 A1 Jan. 31, 2013

(51) Int. Cl.
*H01L 31/119* (2006.01)
*H01L 31/18* (2006.01)

(52) U.S. Cl.
USPC ............ 438/56; 257/252; 257/E31.091

(58) Field of Classification Search
USPC ............ 438/56, 275; 250/370.05, 390.01; 385/27; 257/29
See application file for complete search history.

(56) References Cited

U.S. PATENT DOCUMENTS

| | | |
|---|---|---|
| 5,103,277 A | 4/1992 | Caviglia et al. |
| 5,117,113 A | 5/1992 | Thomson et al. |
| 5,164,805 A | 11/1992 | Lee |
| 5,245,191 A | 9/1993 | Barber et al. |
| 5,589,708 A | 12/1996 | Kalnitsky |
| 6,043,536 A | 3/2000 | Numata et al. |
| 6,107,632 A * | 8/2000 | Lind .................. 250/390.01 |
| 6,208,535 B1 | 3/2001 | Parks |
| 6,977,989 B2 | 12/2005 | Bothe et al. |
| 7,858,425 B2 | 12/2010 | Sanders et al. |
| 7,868,362 B2 | 1/2011 | Randazzo et al. |
| 2004/0094811 A1 | 5/2004 | Takagi |
| 2005/0040462 A1 | 2/2005 | Koh |
| 2005/0194633 A1 | 9/2005 | Mori |
| 2006/0231892 A1 | 10/2006 | Furukawa et al. |
| 2007/0184611 A1 | 8/2007 | Oh et al. |
| 2007/0190740 A1 | 8/2007 | Furukawa et al. |
| 2007/0242920 A1 * | 10/2007 | Lin et al. .................. 385/27 |
| 2007/0275690 A1 | 11/2007 | Hunter et al. |
| 2008/0164528 A1 | 7/2008 | Cohen et al. |
| 2008/0290413 A1 | 11/2008 | Mandelman et al. |
| 2010/0027867 A1 | 2/2010 | Bernhardt et al. |
| 2010/0096556 A1 | 4/2010 | Arsalan et al. |
| 2010/0140488 A1 | 6/2010 | Visconti et al. |
| 2010/0267212 A1 * | 10/2010 | Morris .................. 438/275 |
| 2011/0095194 A1 * | 4/2011 | Orava et al. .......... 250/370.05 |

OTHER PUBLICATIONS

Shaneyfelt, et al., An Embeddable SOI Radiation Sensor, IEEE Transactions on Nuclear Science, Dec. 2009, pp. 3372-3380, vol. 56, No. 6, IEEE.

Annamalai, N. K et al."Radiation Response of Silicon on Diamond (SOD) Devices", IEEE Transactions on Nuclear Science, vol. 40, No. 6, Dec. 1993, p. 1780-1786.

(Continued)

*Primary Examiner* — Jarrett Stark
*Assistant Examiner* — Lawrence Tynes, Jr.
(74) *Attorney, Agent, or Firm* — Cantor Colburn LLP; Louis Percello

(57) ABSTRACT

A method for forming a neutron detector comprises thinning a backside silicon substrate of a radiation detector; and forming a neutron converter layer on the thinned backside silicon substrate of the radiation detector to form the neutron detector. The neutron converter layer comprises one of boron-10 ($^{10}$B), lithium-6 ($^6$Li), helium-3 ($^3$He), and gadolinium-157 ($^{157}$Gd).

14 Claims, 5 Drawing Sheets

(56) References Cited

OTHER PUBLICATIONS

Schwank, J. R. et al., "BUSFET—A Radiation-Hardened SOI Transistor", IEEE Transactions on Nuclear Science, vol. 46, No. 6, Dec. 1999, p. 1809-1816.

Buehler, et al., "On-Chip p-Mosfet Dosimeter", IEEE Transactions on Nuclear Science, vol. 40, No. 6; Dec. 1993; pp. 1442-1449.

Calvo, et al., "Integrated CMOS Linear Dosimeters"; Proceedings. XI Brazilian Symposium on Integrated Circuit Design; Oct. 3, 1998; pp. 1-4.

Moreno, et al., "Radiation Sensor Compatible with Standard CMOS Technology", IEEE Transactions on Nuclear Science, vol. 56, No. 5; Oct. 2009;pp. 2910-2915.

Vargas, et al., "An Approach for Designing Total-Dose Tolerant MCMS Based on Current Monitoring"; Proceedings of 1995 IEEE International Test Conference (ITC); Oct. 21-25, 1995; pp. 345-354.

* cited by examiner

FULLY DEPLETED SILICON ON INSULATOR NEUTRON DETECTOR

BACKGROUND

This disclosure relates generally to the field of radiation monitoring and dosimetry, and more particularly to detection of neutrons, including thermal neutrons, by a solid state radiation detector.

Radiation may come in various forms, including x-ray, γ-ray, β-ray or α-particle emission. There are many types of radiation monitors that may be used to determine an amount of radiation exposure, such as ionization detectors, Geiger counters, and thermoluminescent detectors (TLDs). Geiger counters and ionization detectors may determine and display a dose rate (for example, in mRad/hr) or an integrated dose (for example, in Rads) of radiation exposure in real time. Alarm set points may be programmed based on the dose rate or the integrated dose. A Geiger counter or ionization detector may communicate with a computer for data logging or firmware updates. However, Geiger counters and ionization detectors may be relatively expensive. TLDs allow determination of a dose of radiation based on emission of photons in response to application of heat. TLDs may be relatively inexpensive, but may only be read after a period of exposure time, typically between one and three months. A degree of radiation exposure may only be determined after-the-fact using a TLD; real time dose information is not available.

A semiconductor, or solid state, radiation monitoring device may comprise a metal-oxide-semiconductor field effect transistor (MOSFET) transistor structure having a gate oxide layer fabricated on bulk silicon. A charge is induced in the FET structure by ionizing radiation exposure and trapped in the gate oxide of the FET by a voltage applied to the gate. The threshold voltage ($V_{th}$) of the FET may change according to the amount of trapped holes. A dose of radiation experienced by the solid state radiation monitoring device may be determined by determination of the change in $V_{th}$.

A FET radiation detector may be fabricated using a fully depleted silicon-on-insulator (FDSOI) FET device that is capable of detecting doses of various types of ionizing radiation, and that exhibits long-term charge retention that enables long-term tracking of total radiation dosage. The FDSOI radiation detector may be made as small or large as desired using semiconductor wafer fabrication technology, and may have a relatively low power drain. A charge may be induced in a buried oxide (BOX) layer of the FDSOI radiation detector by radiation exposure and trapped by voltage applied to a back gate contact or body contact. Determination of the amount of induced charge through determination of the $V_{th}$ is then used to determine an amount of radiation exposure experienced by the FDSOI radiation detector. An example of an FDSOI radiation detector is found in U.S. patent application Ser. No. 12/719,962 (Gordon et al.), filed Mar. 9, 2010, assigned to International Business Machines Corporation, which is herein incorporated by reference in its entirety.

While radiation including charged particles such as alpha particles (α), protons (p), and electrons (e), or neutral particles such as x-rays and γ-rays may be detected using a FDSOI radiation detector, neutron detection is more difficult, particularly detection of thermal neutrons. A thermal neutron is a neutron having a relatively slow speed and consequently low energy, and that may only travel a relatively short distance in silicon. The energy (E) of a thermal neutron may be on the same order as the thermal energy of the atoms or molecules of a substance (such as air) through which the thermal neutrons are passing; i.e., about 0.025 electron volts (eV). Thermal neutrons are responsible for various types of nuclear reactions, including nuclear fission. Thermal neutron detection is important as higher-energy neutrons from such radiation sources as weapons of mass destruction (WMD), improvised nuclear devices (IMD), or the detonation of nuclear bombs become thermalized as the neutrons pass through air or other materials.

BRIEF SUMMARY

In one aspect, a method for forming a neutron detector includes thinning a backside silicon substrate of a radiation detector; and forming a neutron converter layer on the thinned backside silicon substrate of the radiation detector to form the neutron detector.

In another aspect, a neutron detector includes a field effect transistor (FET) device formed on a silicon-on-insulator (SOI) substrate, the SOI substrate comprising a backside silicon substrate, the backside silicon substrate having a thickness from about 1 micrometer to about 30 micrometers; and a neutron converter layer located on the backside silicon substrate.

In another aspect, a method of detecting neutrons using a neutron detector, the neutron detector comprising a neutron converter layer located on a backside silicon substrate of the neutron detector, includes exposing the neutron detector to neutrons such that the neutrons impinge on the neutron converter layer; releasing, by the neutron converter layer, secondary charged particles in response to the thermal neutrons impinging on the neutron converter layer, such that the secondary charged particles travel from the neutron converter layer through the backside silicon substrate; and detecting the secondary charged particles by the neutron detector.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Figure 1:
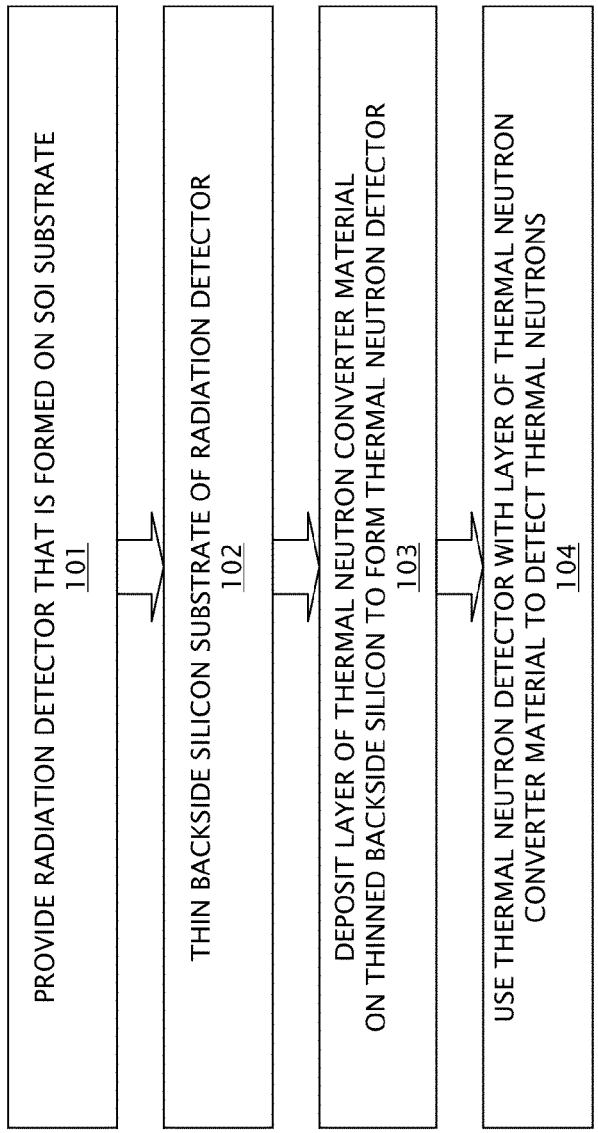
FIG. 1 is a flowchart illustrating an embodiment of a method of forming a FDSOI neutron detector.

Embodiments of a FDSOI neutron detector, and methods of forming and using a FDSOI neutron detector, are provided, with exemplary embodiments being discussed below in detail. Relatively high-energy neutrons, having an energy of about 5 mega electron volts (MeV) or greater, may cause spallation (e.g., inelastic collisions) when they impinge on silicon, generating secondary charged particles that emit from the silicon. The secondary charged particle may be detected by a FDSOI radiation detector. However, in the case of relatively low-energy thermal neutrons, spallation does not occur when the thermal neutron impinges on silicon, so the thermal neutrons may not be directly detected by a FDSOI radiation detector. Therefore, a layer of a neutron converter material may be applied to a FDSOI radiation detector, forming a FDSOI neutron detector. When neutrons, including thermal neutrons, impinge on the neutron converter material, a reaction occurs, and secondary charged particles are released by the neutron converter material. The secondary charged particles emitted by the neutron converter material are detected by the FDSOI neutron detector. A FDSOI neutron detector is a small, portable neutron detector that may be embedded into relatively small items, such as inside drivers' licenses, for monitoring of radiation exposure. The fabrication process for a FDSOI neutron detector may also be relatively simple and inexpensive.

The neutron converter material may comprise any of the following isotopes: boron-10 ($^{10}$B), lithium-6 ($^{6}$Li), helium-3 ($^{3}$He), or gadolinium-157 ($^{157}$Gd). Some exemplary reactions that occur between thermal neutrons and the various neutron converter materials are listed in Table 1. The first column lists the various neutron converter materials, the incoming particles (neutrons n, which may be thermal or non-thermal neutrons), and the outgoing secondary charged particles (alpha particles a; protons p; or electrons e) for the reaction. The second column gives the percentage of the particular isotope that is typically found in a sample of the particular element, i.e., for a typical sample of boron, about 19.8% of the sample will be $^{10}$B. Shown in the third and fourth columns are the particles that are emitted in the reaction, and their approximate energy. The cross section, shown in the fifth column, is a measure of the probability of the reaction occurring, which is expressed in Barns for the reactions shown in the first column when initiated by thermal neutrons. A Barn is defined as $10^{-28}$ m$^2$ and is approximately the cross-sectional area of a uranium nucleus. A reaction with a higher cross section is more likely to occur than a reaction with a lower cross section. The reactions shown below in Table 1 have relatively large cross section values for neutron conversion.

TABLE 1

| Reaction | Isotopic Abundance | Emitted particle and energy | Emitted particle and energy | Cross Section (B) |
|---|---|---|---|---|
| $^{10}$B(n, α) | 19.8% | $^{7}$Li, 0.84 MeV[1] | α, 1.47 MeV[1] | 3840 |
| | | $^{7}$Li, 1.02 MeV[2] | α, 1.78 MeV[2] | 3840 |
| $^{6}$Li(n, α) | 7.4% | $^{3}$H, 2.73 MeV | α, 2.05 MeV | 940 |
| $^{3}$He(n, p) | 1.4E–4% | $^{3}$H, 0.19 MeV | p, 0.57 MeV | 5530 |
| $^{157}$Gd(n, e) | 15.7% | 72 keV | | 255,000 |

[1]this reaction occurs 94% of the time
[2]this reaction occurs 6% of the time

The reactions shown above in Table 1 result in outgoing secondary charged particles having relatively low energy. The neutron converter layer may be formed on the backside silicon substrate of the FDSOI neutron detector in some embodiments, such that the secondary charged particles must travel through the backside silicon substrate to induce a charge FDSOI neutron detector. However, relatively low-energy secondary charged particles may have a short range (for example, a few micrometers) in silicon, and may be stopped in the silicon completely if directed into relatively thick silicon substrate. If secondary charged particles emitted by the neutron converter material are stopped inside the backside silicon substrate of the FDSOI neutron detector, the secondary charged particles will not induce charge in the FDSOI neutron detector, and will not be detected. Therefore, the backside silicon substrate of the FDSOI neutron detector must have an appropriate thickness before application of the neutron converter material so that the secondary charged particles may travel through the backside silicon substrate of the FDSOI neutron detector. The appropriate thickness may be achieved by thinning of the backside silicon substrate before formation of the layer of the neutron converter material, and is discussed in further detail below with respect to block 102 of FIG. 1.

Figure 2:
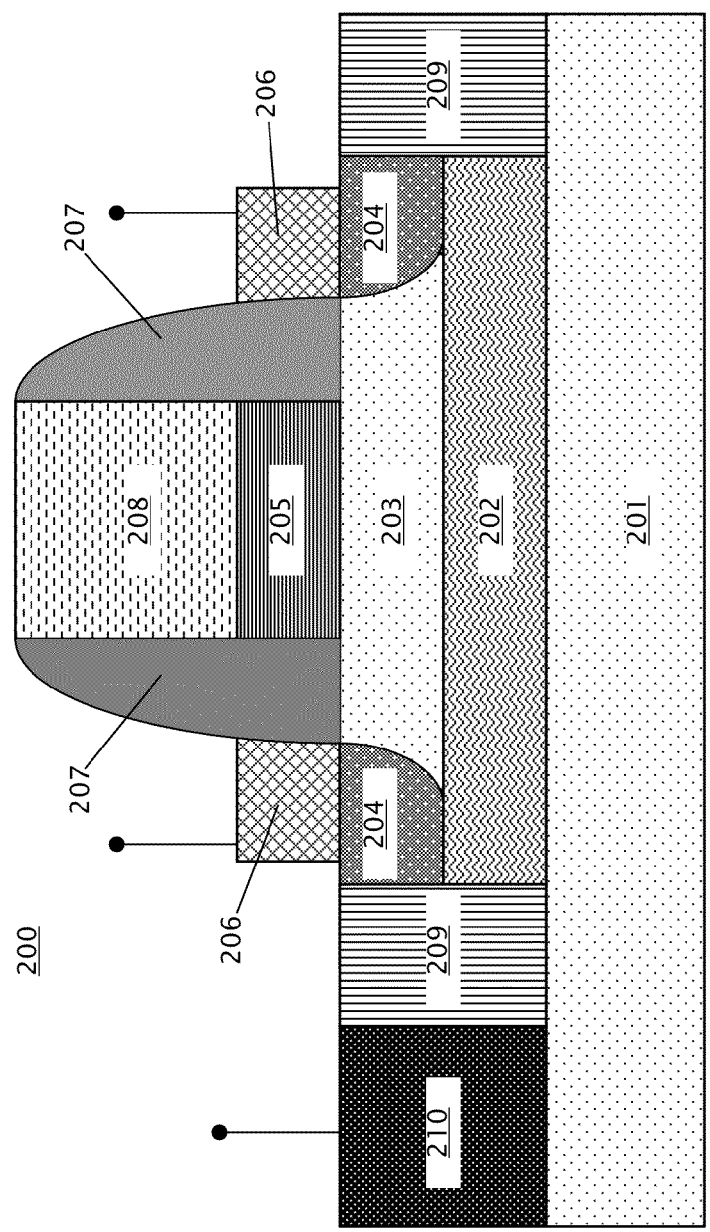
FIG. 2 is a cross sectional view illustrating an embodiment of a FDSOI radiation detector.

FIG. 1 shows a flowchart of an embodiment of a method 100 of forming a FDSOI neutron detector. First, in block 101, a FDSOI radiation detector formed on a silicon-on-insulator (SOI) substrate is provided. An embodiment of a FDSOI radiation detector 200 is shown in FIG. 2. The FDSOI radiation detector 200 includes backside silicon substrate 201, buried oxide (BOX) layer 202, and a FET including SOI 203, which comprises the FET channel region, source/drain regions 204, gate oxide layer 205, gate contact 208, spacers 207, and source/drain contacts 206. In various embodiments, gate contact 208 may include polysilicon, spacers 207 may include nitride, and source/drain contacts 206 may include aluminum (Al). Shallow trench isolation (STI) regions 209, which may include trenches filled with a dielectric material such as oxide, are located on either side of the source/drain regions 204 of the FET, and body contact 210 is located on backside silicon substrate 201 and is separated from the FET by a STI region 209. Radiation exposure experienced by FDSOI radiation detector 200 causes a charge to build up in BOX layer 202. A voltage applied at the body contact 210 traps the radiation-induced charge in the BOX layer 202. The $V_{th}$ of the FDSOI radiation detector 200 is determined via gate contact 208 and source/drain contacts 206, and the amount of charge stored in BOX layer 202 is determined from the $V_{th}$. An amount of radiation to which the FDSOI radiation detector 200 has been exposed may then be determined from the amount of charge stored in BOX layer 202.

Figure 3:
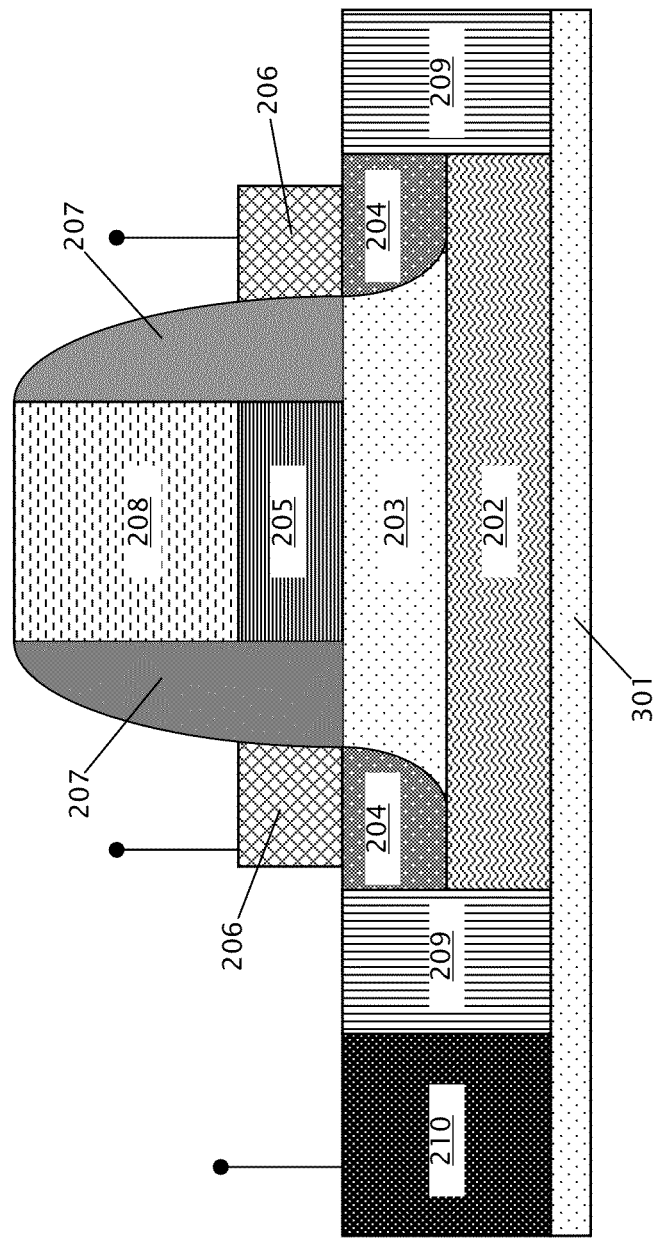
FIG. 3 is a cross sectional view illustrating an embodiment of the device of FIG. 2 after thinning of the backside silicon.

Returning to FIG. 1, in block 102, the backside silicon substrate of the FDSOI radiation detector is thinned. The backside silicon substrate may be thinned using any appropriate thinning technique. In some embodiments, the backside silicon substrate may be thinned using a xenon diflouride (XeF$_2$) etch. In other embodiments, the backside silicon substrate may be thinned by grinding. An appropriate thickness for the thinned backside silicon may be determined based on the material selected for the neutron converter layer (discussed in further detail below with respect to block 103 of FIG. 1). FIG. 3 shows an embodiment of the FDSOI radiation detector 200 after thinning of the backside silicon substrate 201 to form thinned backside silicon 301. The thinned backside silicon 301 must have a thickness that allows secondary charged particles emitting from the neutron converter layer to travel through the thinned backside silicon 301 to the BOX layer 202. The thinned backside silicon 301 may have a thickness from about 1 micrometer to about 30 micrometers in various embodiments. For some exemplary embodiments, a neutron detector including a $^{10}$B neutron converter layer may have a thinned backside silicon 301 thickness from about 2 micrometers to about 5 micrometers; a neutron detector including a $^{6}$Li neutron converter layer may have a thinned backside silicon 301 thickness from about 2 micrometers to about 7 micrometers; a neutron detector including a $^{3}$He neutron converter layer may have a thinned backside silicon 301 thickness from about 2 micrometers to about 5 micrometers; and a neutron detector including a $^{157}$Gd neutron converter layer may have a thinned backside silicon 301 thickness from about 2 micrometers to about 30 micrometers.

Figure 4:
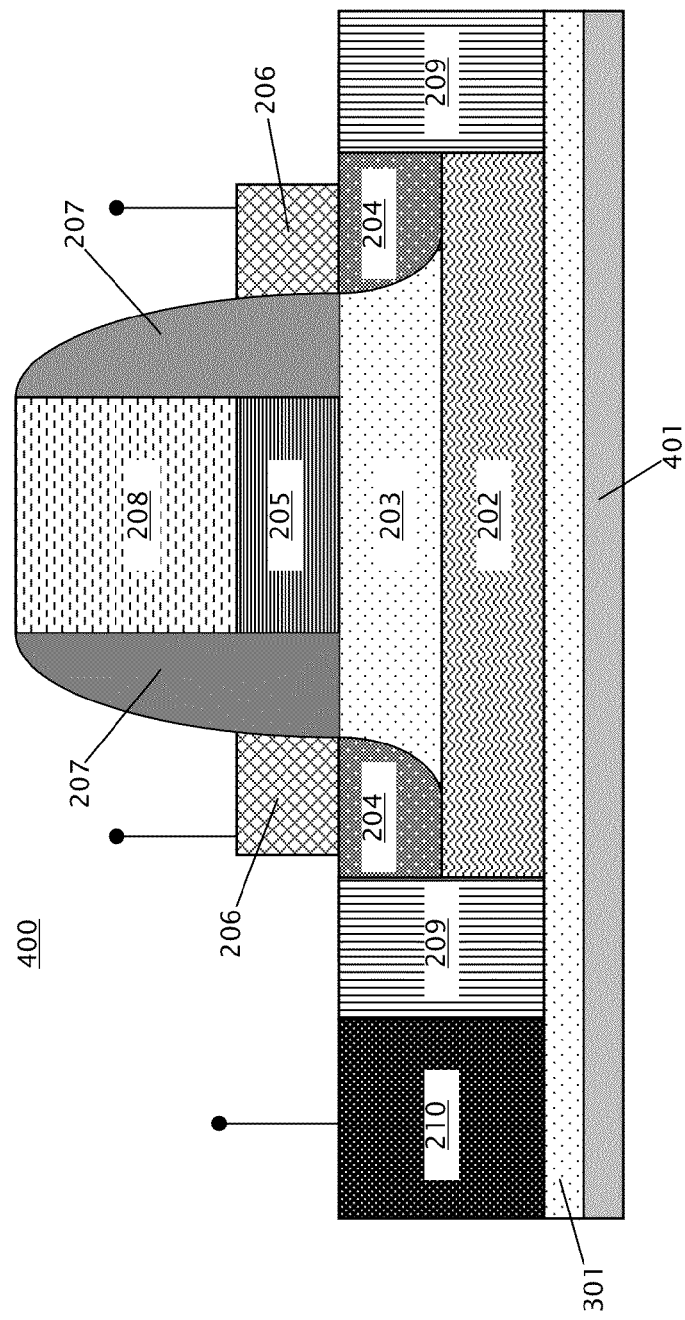
FIG. 4 is a cross sectional view illustrating an embodiment of the device of FIG. 3 after application of a neutron converter to the thinned backside silicon to form a FDSOI neutron detector.

Turning again to FIG. 1, in block 103, the neutron converter layer is formed on the thinned backside silicon to form the FDSOI neutron detector. The neutron converter layer may be formed on thinned backside silicon by any appropriate method. In some embodiments, sheets of the neutron converter material having an appropriate thickness may be placed on the thinned backside silicon. In other embodiments, the material comprising neutron converter layer may be sputtered or evaporated to an appropriate thickness. FIG. 4 shows an embodiment of a FDSOI neutron detector 400 including a neutron converter layer 401 formed on thinned backside silicon 301. The neutron converter layer 401 may comprise one of $^{10}$B, $^{6}$Li, $^{3}$He, or $^{157}$Gd, and may be enriched with the desired isotope in some embodiments. The neutron converter layer 401 may have a thickness from about 0.1 nanometers to about 2.0 micrometers in some embodiments.

Figure 5:
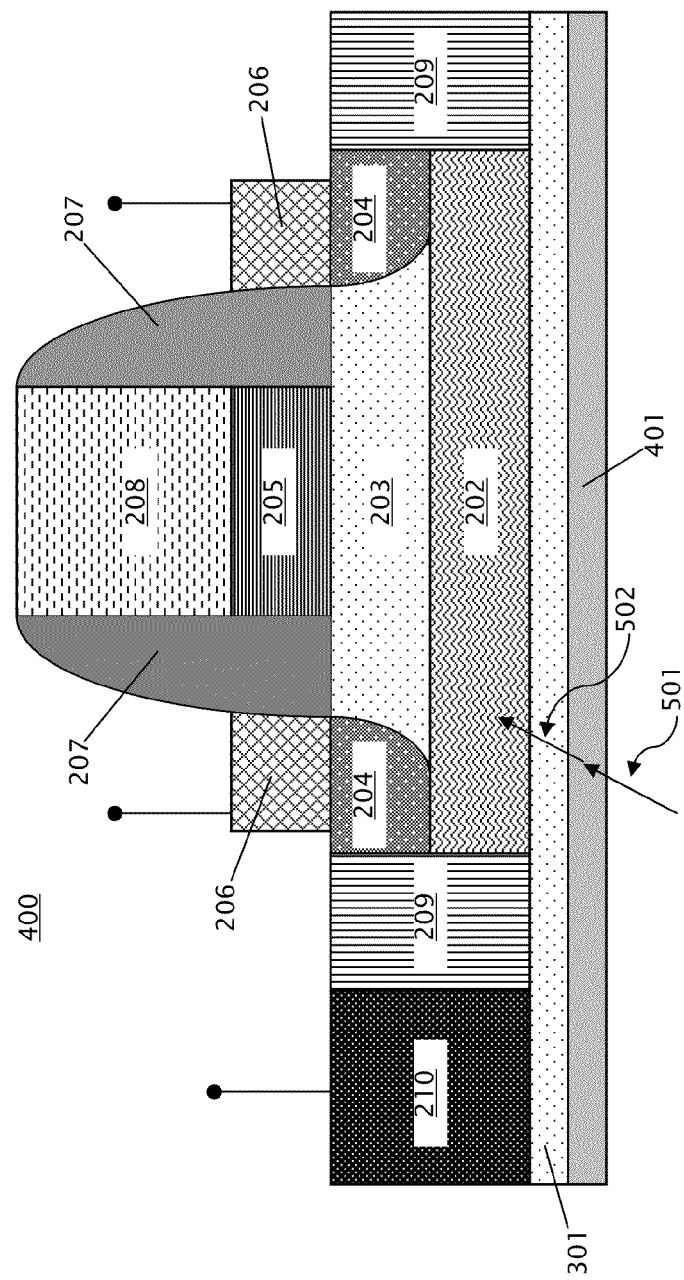
FIG. 5 is a cross sectional view illustrating an embodiment of the device of FIG. 5 in operation as an FDSOI neutron detector.

Lastly, turning again to FIG. 1, in block 104 the FDSOI neutron detector is used to detect neutrons, including thermal neutrons. FIG. 5 shows an embodiment of the FDSOI neutron detector 400 in operation. A thermal neutron 501 comes into contact with neutron converter layer 401, and a reaction occurs such as was described with respect to Table 1 above, releasing a secondary charged particle 502 from neutron converter layer 401. The secondary charged particle 502 travels through the thinned backside silicon 301 and induces a charge in the BOX layer 202. A voltage may be applied at the body contact 210 to improve the trapping of the radiation-induced charge in the BOX layer 202. The $V_{th}$ of the FDSOI neutron detector 400 is determined via gate contact 208 and source/drain contacts 206, and the amount of charge stored in BOX layer 202 is determined from the $V_{th}$. An amount of neutron radiation to which the FDSOI neutron detector 400 has been exposed may then be determined from the amount of charge stored in BOX layer 202. The FDSOI neutron detector 400 detects neutrons, including thermal neutrons from any direction, as the neutrons easily penetrate the top of the FDSOI neutron detector 400 to reach the neutron converter layer 401 and cause the reaction that generates the secondary charged particles.

In some embodiments, a layer of neutron converter material may be additionally or alternately applied to the top of a FDSOI neutron detector. However, in such embodiments, additional patterning is necessary to avoid shorting out the source/drain contacts 206, gate contact 208, and body contact 210, requiring extra processing steps to mask out this region. Thinning the backside silicon substrate and forming the neutron converter layer directly on the thinned backside silicon is a comparatively less complex and time-consuming process. In addition, forming the neutron converter layer on the backside results in a relatively large detection area that ensures good sensitivity of the FDSOI neutron detector. The FDSOI radiation detector of FIGS. 2-5 is shown for illustrative purposes only; in various embodiments, a neutron converter layer may be used in conjunction with any configuration of FDSOI radiation detector to allow detection of thermal neutrons.

The technical effects and benefits of exemplary embodiments include detection of thermal neutrons using a relatively small, inexpensive solid state detector.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for forming a neutron detector, the method comprising:
   thinning a backside silicon substrate of a radiation detector, wherein the radiation detector comprises a field effect transistor (FET)-based radiation detector formed on a top silicon layer of a silicon-on-insulator (SOI) substrate, the SOI substrate comprising the top silicon layer, a buried oxide (BOX) layer underneath the top silicon layer, and the backside silicon substrate underneath the BOX layer;
   forming a neutron converter layer on the thinned backside silicon substrate of the radiation detector to form the neutron detector;
   applying a voltage to a body contact of neutron detector, the body contact being adjacent to the thinned backside silicon substrate;
   exposing the neutron converter layer to neutrons;
   releasing, by the neutron converter layer, secondary charged particles based on the neutrons; and
   storing an amount of charge in the BOX layer based on the secondary charged particles, wherein the voltage applied to the body contact traps the amount of charge in the BOX layer.

2. The method of claim 1, wherein the neutron converter layer comprises boron-10 ($^{10}$B).

3. The method of claim 1, wherein the neutron converter layer comprises lithium-6 ($^{6}$Li).

4. The method of claim 1, wherein the neutron converter layer comprises helium-3 ($^{3}$He).

5. The method of claim 1, wherein the neutron converter layer comprises gadolinium-157 ($^{157}$Gd).

6. The method of claim 1, wherein thinning the backside silicon substrate of the radiation detector comprises a xenon diflouride (XeF$_2$) etch.

7. The method of claim 1, wherein thinning the backside silicon substrate of the radiation detector comprises grinding.

8. The method of claim 1, wherein forming the neutron converter layer on the thinned backside silicon substrate comprises applying a sheet of the neutron converter material to the thinned backside silicon substrate.

9. The method of claim 1, wherein forming the neutron converter layer on the thinned backside silicon substrate comprises one of deposition and sputtering.

10. The method of claim 1, wherein the neutrons comprise thermal neutrons.

11. The method of claim 1, wherein the body contact is separated from the BOX layer and the FET-base radiation detector by a shallow trench isolation (STI) region.

12. The method of claim 1, further comprising determining the amount of charge stored in the BOX layer; and
   determining an amount of neutron exposure by the neutron detector based on the determined amount of charge.

13. The method of claim 12, wherein the amount of charge is determined based on a threshold voltage of the FET-based radiation detector.

14. The method of claim 13, wherein the threshold voltage is determined via a gate contact, a source contact, and a drain contact of the FET-based radiation detector.

\* \* \* \* \*